(12) United States Patent
Brenndoerfer et al.

(10) Patent No.: US 7,279,969 B2
(45) Date of Patent: Oct. 9, 2007

(54) SIGNAL AMPLIFICATION METHOD AND AMPLIFIER ARRAY

(75) Inventors: Knut Brenndoerfer, Blaustein (DE); Karl-Josef Gropper, Senden (DE); Udo Karthaus, Ulm (DE); Herbert Knotz, Erbach (DE); Stefan Schabel, Syrgenstein (DE)

(73) Assignee: Atmel Germany GmbH, Heilbronn (DE)

( * ) Notice: Subject to any disclaimer, the term of this patent is extended or adjusted under 35 U.S.C. 154(b) by 95 days.

(21) Appl. No.: 11/315,252

(22) Filed: Dec. 23, 2005

(65) Prior Publication Data

US 2006/0139090 A1   Jun. 29, 2006

(30) Foreign Application Priority Data

Dec. 23, 2004   (DE) ...................... 10 2004 063 200

(51) Int. Cl.
*H03F 1/36* (2006.01)
(52) U.S. Cl. ........................................ 330/86; 330/279
(58) Field of Classification Search ................. 330/86, 330/279, 254, 278, 282
See application file for complete search history.

(56) References Cited

U.S. PATENT DOCUMENTS 4,881,047 A * 11/1989 Waller, Jr. .................. 330/282
5,123,024 A    6/1992 Dowd et al.
6,166,597 A   12/2000 Gropper et al.
7,088,179 B2 *  8/2006 Gilbert et al. ............... 330/254
7,123,098 B2 * 10/2006 Bae et al. .................... 330/308

FOREIGN PATENT DOCUMENTS

| DE | 42 25 621 A1 | 2/1993 |
| DE | 198 23 096 A1 | 12/1999 |
| EP | 0 213 784 | 3/1987 |
| EP | 0 434 466 A2 | 6/1991 |

* cited by examiner

*Primary Examiner*—Henry Choe
(74) *Attorney, Agent, or Firm*—McGrath, Geissler, Olds & Richardson, PLLC

(57) ABSTRACT

An amplifier array includes a servo amplifier, which has a reference signal input, a return signal input, and an output signal connection, which supplies an output signal path, a reference signal generator, which supplies reference signals with different level heights to the reference signal input, and with a return, which supplies a signal, attenuated by a value of the feedback attenuation, from the output path as a return signal to the return signal input, whereby the servo amplifier supplies an amplified difference between the reference signal and return signal in the output signal path. The amplifier array has a connectable bypass gain path, which in the connected state is supplied phase-coupled to the reference signal generator and which supplies a bypass output signal in the output path.

14 Claims, 3 Drawing Sheets

SIGNAL AMPLIFICATION METHOD AND AMPLIFIER ARRAY

This nonprovisional application claims priority under 35 U.S.C. § 119(a) on Patent Application No. 10 2004 063 200.6, which was filed in Germany on Dec. 23, 2004, and which is herein incorporated by reference.

BACKGROUND OF THE INVENTION

1. Field of the Invention

The invention relates to a signal amplification method, in which a difference between a reference signal, having different level heights, and a return signal, attenuated by feedback attenuation, of an output signal path is amplified by a servo gain path.

The invention relates further to an amplifier array with a servo amplifier, which has a reference signal input, a return signal input, and an output signal connection, which supplies an output signal path, a reference signal generator, which supplies reference signals with different level heights to the reference signal input, and with a return, which supplies a signal, attenuated by a value of the feedback attenuation, from the output path as a return signal to the return signal input, whereby the difference amplifier supplies an amplified difference between the reference signal and return signal in the output signal path.

In this regard, the term servo gain describes a gain that is substantially greater than the value one.

2. Description of the Background Art

A signal amplification method of this type and an amplifier array of this type are known from DE 198 23 096 A1, which corresponds to U.S. Pat. No. 6,166,597, and are used, for example, to operate a laser diode for CD and/or DVD devices. During the read operation (read), the laser diode is operated with direct current, on which a high-frequency signal is superimposed. The high-frequency signal reduces noise effects of the laser diode, but basically causes unwanted spurious emission. As a remedy, the noise effects are additionally suppressed by a relatively high bandwidth of the loop gain of a loop closed by optical feedback. Because of the additional suppression of noise effects by the high bandwidth, the amplitude of the high-frequency signal and thereby the unwanted spurious emission can be kept relatively low. In erase and write operations, the output signal, which is represented in this application by the emitted optical power of the laser diode, follows a reference signal, which serves as the input signal for the amplification. In this regard, during the erase operation and during the write operation, different high optical powers are necessary, which are generated by variably high levels of the reference signal. The write operation as a rule requires the highest optical power. Depending on the write/read strategy, any desirable high level can be necessary or favorable.

In general, steep edges of the current pulses are desired, with which the laser diodes are controlled. DE 198 23 096 deals with a loop gain, and which, on the one hand, is to be as high as possible, but on the other, may not lead to instabilities. In this regard, the loop gain is understood to be the total gain active in the loop. In DE 198 23 096, it is proposed in this context to control the loop gain and thereby to allow the actual value of a controlled variable (e.g., the laser diode optical power) during a pulse-shaped change of a command variable (e.g., of the reference signal) to overshoot the setpoint value by a preset tolerance value.

A basic problem here is that rapid changes within a time span, as are necessary for steep pulse edges, proceed with a large bandwidth in the frequency range. The limited bandwidth of control loop components therefore leads to an unwanted limitation of the edge steepness, which, for example, is obstructive to a fast write speed.

SUMMARY OF THE INVENTION

It is therefore an object of the present invention to provide a signal amplification method and an amplifier array, by which steeper edges, particularly for the pulse-controlled erase and write operations, can be generated, without the advantages of the control loop being lost, in particular the good noise suppression in conjunction with low spurious emission during the read operation.

This object is achieved in that the servo gain path during operation with large level changes is connected to a bypass gain path, which is supplied phase-coupled to the reference signal and supplies the output signal path together with the servo gain path.

Furthermore, this object is achieved by an amplifier array that has a connectable bypass gain path, which is supplied in the connected state phase-coupled to the signal of the reference signal generator and which supplies a bypass output signal in the output signal path.

By means of these features, large level changes, which are necessary, for example, during a fast write operation of a laser diode, are generated by the bypass gain path. In the bypass gain path, the limited bandwidth of the control loop of the servo amplifier is not active, so that the disadvantage of the bandwidth-limited edge steepness is effectively avoided. For smaller level changes, as occur in the write operation, in contrast, the control loop can be used further with the servo gain path, so that particularly the advantage of good noise suppression at low spurious emission is retained during the read operation.

Within the scope of embodiments of the signal amplification method, it is preferable that the servo amplifier is operated with a smaller bandwidth with the connected bypass gain path than without the connected bypass gain path.

The operation of the servo gain path with a smaller bandwidth, because of the aforementioned time-bandwidth relationship, leads to a slower response of the servo gain path to changes in the reference signal. In connection with the bypass gain path, connected in this case, the desired effect results that the rapid bypass gain path generates the greater part of the rapid changes, whereas the now slower servo gain path generates the greater part of the slower signal changes, as are necessary, for example, for compensating a drift in an average value of the controlled variable. In other words: this embodiment effects at least a partial decoupling of the paths and therefore leads to task splitting between the paths.

A controllable amplification of the bypass gain path can be set to a function of the reciprocal value of the feedback attenuation.

As a result, in the ideal case, the same signals are established at the return signal input and at the reference signal input of the servo amplifier. The input of the servo amplifier is thereby not modulated in the ideal case. This results in a complete decoupling of both paths and thereby in a clear task separation.

Furthermore, the difference between the reference signal and return signal can be determined by a sensor.

This embodiment permits a rechecking of the amplification of the bypass gain path, because the difference during a transient servo gain path and suitable amplification of the bypass gain path must assume a preset value, for example, the value zero.

The amplification of the bypass gain path can be controlled by a sensor-coupled controller as a function of the determined difference.

By means of these features, the amplification of the bypass gain path is integrated to a certain extent into other closed control loops, by which a suitable amplification is set.

Alos, a difference between the maximum values of the return signal and the maximum values of the reference signal and/or a difference between the minimum values of the return signal and the minimum values of the reference signal can be formed.

The determination of this value permits setting of the amplification of the bypass gain path during dynamic operation, which is understood here to be operation with pulses.

It is preferred, furthermore, that overproportionally greater pulse changes in the bypass gain path are set during operation with high signal levels of the reference signal than during operation with low signal levels of the reference signal.

This embodiment in the case of nonlinearity in the signal path as well, as occurs, for example, during operation of laser diodes with nonlinear characteristics, permits an appropriate setting of the amplification in different regions of the nonlinearity.

In regard to embodiments of the amplifier array, a bandwidth of the servo amplifier can be modifiable between variably large values and the servo amplifier can work with smaller bandwidths with the connected bypass gain path than without the connected bypass gain path.

The bypass gain path can have a controllable amplification and the amplifier array can set the controllable amplification to a function of the reciprocal value of the feedback attenuation.

Additional embodiments include a sensor, which determines the difference between the reference signal and return signal.

An improvement of this embodiment provides for a sensor-coupled controller, which controls the amplification of the bypass gain path depending on the determined difference.

The sensor can form a difference between the maximum values of the return signal and the maximum values of the reference signal and/or a difference between the minimum values of the return signal and the minimum values of the reference signal.

Furthermore, the amplifier array for setting the controllable amplification of the bypass gain path to a function of the reciprocal value of the feedback attenuation sets overproportionally greater pulse changes in the bypass gain path during operation with high signal levels of the reference signal than at the low signal levels of the reference signal.

For the aforementioned embodiment of the amplifier array, the same advantages arise as in the corresponding methods claims, so that reference can be made to the advantages described further above in this regard.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
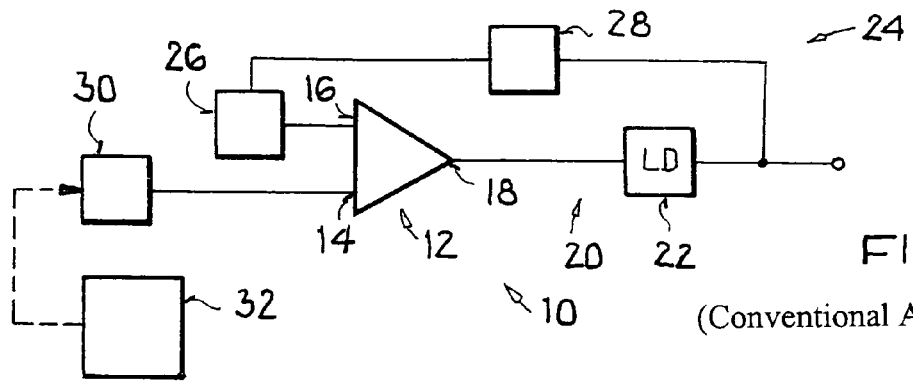
FIG. 1 illustrates a conventional amplifier array.

FIG. 1 shows a conventional amplifier array 10 with a servo amplifier 12, which has a reference signal input 14, a return signal input 16, and an output signal connection 18. The output signal connection 18 supplies an output signal path 20, in which a component 22 to be driven is located, which supplies, inter alia, a return 24. Component 22 is, e.g., a laser diode in a CD or DVD device. The return 24 in this case includes an optical coupling between laser diode 22 and photodiode 26, which supplies a signal, attenuated by a value of the feedback attenuation, from output signal path 20 as a return signal to return signal input 16 of servo amplifier 12. In FIG. 1, the feedback attenuation is represented by a block 28, which also contains the effects of laser diode 22 on the feedback attenuation. Amplifier array 10 furthermore has a reference signal generator 30, which is controlled by a controller 32, and depending on the control signals of controller 32, reference signals with different level heights are supplied to reference signal input 14.

Figure 2:
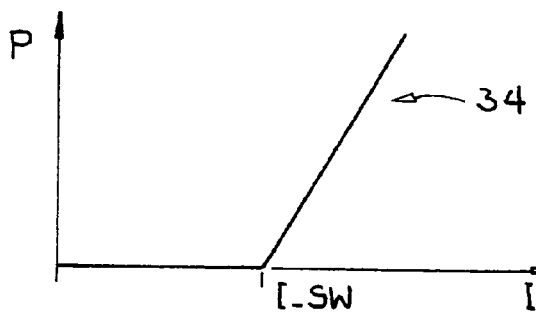
FIG. 2 shows a first characteristic of a laser diode, which has a linear course.

The laser diode 22 of FIG. 1 has, e.g., a characteristic 34 (shown in FIG. 2) which is linear in sections and which shows the dependence of the emitted optical power P on current I as the output signal of servo amplifier 12. It is typical for such characteristics that a measurable optical power occurs-only above a laser threshold, which is reached at a threshold value I_SW of the driving current I, or is exceeded. In the subject of FIG. 1, controller 32 controls reference signal generator 30 for a read operation of laser diode 22 so that reference signal generator 30 supplies a direct current signal to reference signal input 14. The aforementioned high-frequency signal can be supplied to the signal path, for example, before laser diode 22. Servo amplifier 12 responds to the direct current input signal with the output of an output current I, which turns on laser diode 22 and activates return 24. The control loop then settles into a continuous output power of laser diode 22, whereby a finite difference of the return signal is set at return signal input 16 and the reference signal at reference signal input 14. Noise influences are suppressed during the read operation by the loop amplification occurring with a relatively large bandwidth in conjunction with the superimposed high-frequency signal. During the write operation, the optical power of the laser diode follows a reference signal varying between various level heights.

Figure 3:
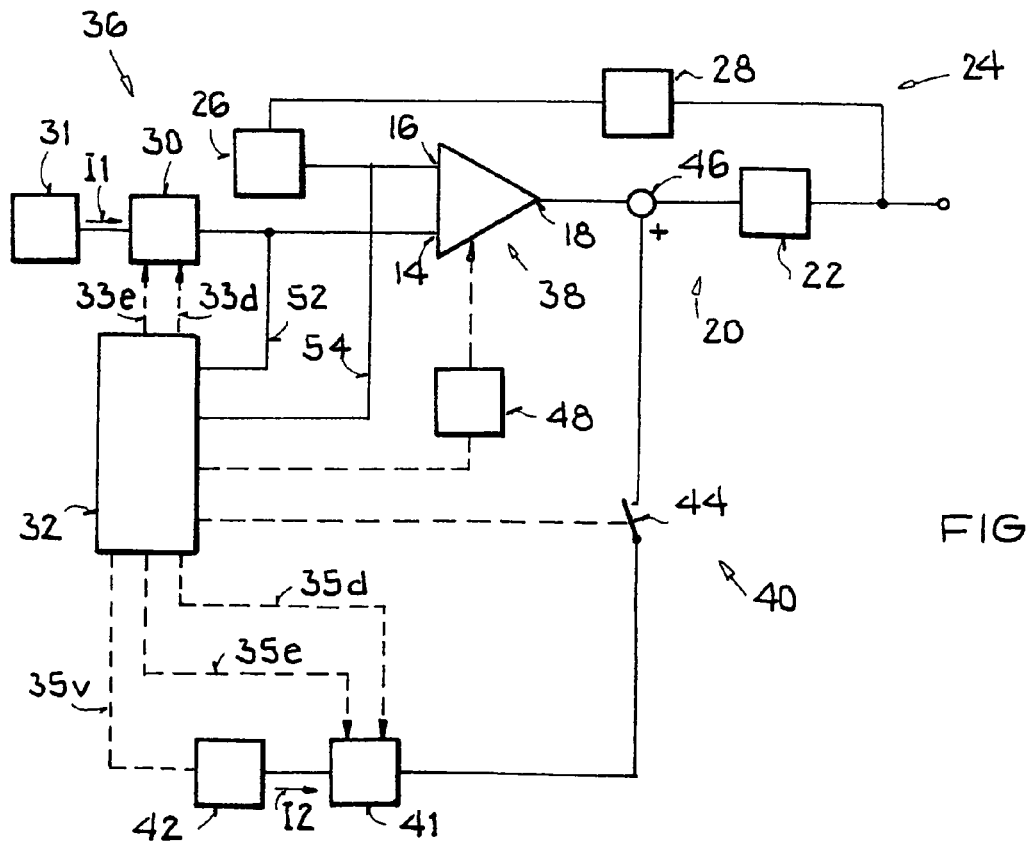
FIG. 3 illustrates a first embodiment of the amplifier array of the invention.

FIG. 3 shows an amplifier array 36, in which the features of the invention and features of embodiments of the invention are realized. Amplifier array 36 has a servo amplifier 38, which can correspond to servo amplifier 10 of FIG. 1. Servo amplifier 38, however, can have additional features within the scope of embodiments of the invention and is therefore designated with its own reference character 38. It is sufficient at first, however, that servo amplifier 38 has a reference signal input 14, a return signal input 16, and an output signal connection 18 and insofar corresponds to servo amplifier 10 of FIG. 1.

Furthermore, amplifier array 36 has output signal path 20, laser diode 22, return 24, photodiode 26, feedback attenuation 28, and reference signal generator 30 with a direct current source 31, and a controller 32. Direct current source 31 supplies a direct current I1 to reference signal generator 30. Controller 32 via connections 33e and 33d, shown as dotted lines, supplies enable signals and data signals to reference signal generator 30. The current strength and thereby in particular a pulse height of the reference signal relative to current I1 are set by the data signals, whereas the enable signals in the simplest case turn on or off the reference signal and/or the pulses superimposed on the reference signal. In general, reference signal generator 30 has several digital-analog converters (DACs), which are controlled by individual enable signals and data signals and whose contributions to the reference signal are summed up.

In its broadest realization, amplifier array 36 differs from the conventional amplifier array 10 in a connectable bypass gain path 40, which in the connected state is supplied phase-coupled to the signal of the reference signal generator 30 and which supplies a bypass output signal in output signal path 20. In the depicted case, bypass gain path 40 is supplied by its own reference signal generator 41, which can be constructed in analogy to reference signal generator 30 of servo amplifier 38. Controller 32 supplies enable signals and data signals to reference signal generator 41 via connections 35e and 35d, shown as dotted lines. A direct current source 42 supplies a direct current I2 to reference signal generator 41. Direct current I2 can be set by controller 32 and can be set to values greater or smaller than I1. To that end, controller 32 supplies amplification control signals via the dotted-line connection 35v to direct current source 42. Direct current source 42 thereby represents a bypass amplifier 42, which can provide variable amplifications and/or variable attenuations of I2 relative to I1 and is located on the input side of reference signal generator 41. The phase-coupled supplying of both paths is created within the scope of this embodiment by phase-coupled enable signals for reference signal generators 30 and 41.

The output signal of reference signal generator 30 in the servo gain path and of reference signal generator 41 in bypass gain path 40 can be identical, have a phase shift, or also have different level heights. The two reference signals, however, should have a uniform phase relation, thus a phase coupling. In the case of phase shifts, it is preferred that the enable signals of the servo gain path are delayed relative to the enable signals of the bypass gain path. It is understood, furthermore, that an amplification can occur alternatively or in addition on the output side of reference signal generator 41.

The connection of bypass path 40 occurs in the subject of FIG. 3 by switch 44, which is actuated by controller 32. It is understood, however, that the connection can be realized alternatively by means of suitable enable signals for reference signal generator 41. The supplying in output signal path 20 occurs by a summation node 46, which is located in the output signal path 20 between output signal connection 18 of servo amplifier 38 and laser diode 22. In each case, bypass gain path 40 is supplied phase-coupled to the reference signal at input 14 of servo amplifier 38 and with a closed switch 44, in turn, supplies output signal path 20. It is understood that further signal amplification and/or supplying of a high-frequency signal can occur between summation node 46 and laser diode 22.

With the amplifier array 36 described herein, the methods aspect of the invention is realized in its broadest form in that with great level changes of the reference signal emitted by reference signal generator 30, bypass gain path 40 is connected and/or activated by suitable enable signals. By this means, with large level changes of the reference signal, requiring steep edges, servo amplifier 38 is bridged, and bypass gain path 40 supplies the amplified reference signal level to the output signal path 20 by bypassing servo amplifier 38. Because the edge steepness of bypass gain path 40, in contrast to the edge steepness of the servo amplification control loop, is not limited by the bandwidth of the control loop components, amplifier array 36 with bypass gain path 40 allows substantially faster write speeds. During the read operation, in contrast, preferably switch 44 is opened so that servo amplifier 38 alone drives laser diode 22. The control loop, fully active in this case, comprising servo amplifier 38, laser diode 22, and return 24 provides the already mentioned good noise suppression in conjunction with a low spurious emission.

As far as amplifier array 36 has been described to this point, servo amplifier 38 is also still active during the write operation, which could lead to unwanted interactions with bypass gain path 40. To reduce these interactions, an embodiment of the invention provides that the bandwidth of servo amplifier 38 is reduced during the write operation. This is represented in FIG. 3 by block 48, which is actuated parallel to an actuation of switch 44 and with a closed switch 44 reduces the bandwidth of servo amplifier 38. In so doing, the bandwidth of servo amplifier 38 is reduced so far that it can no longer follow the rapid changes in the reference signal during the write operation and provides only an average value of a fast write pulse sequence at output signal connection 18. Thereby, the capacity of servo amplifier 38 is still retained for supplying both the threshold value I_SW and a constant component, exceeding this, of the write pulse sequence. As a result, even an extensive decoupling of the tasks of the servo gain path with servo amplifier 38 and bypass gain path 40 with bypass amplifier 42 is achieved.

An even more extensive decoupling of the servo gain path and bypass gain path 40 is achieved in that controller 32 sets the amplification of the bypass gain path 40 in the ideal case to a function of the reciprocal value of the entire feedback attenuation, active in the control group, precisely so that the signal applied at inputs 14, 16 of servo amplifier 38 are the same. The difference between the reference signal, having great changes in level, and the return signal is applied at inputs 14, 16 of servo amplifier 38. Because servo amplifier 38 works with a reduced bandwidth and thereby more or less as a low-pass filter, in the ideal case, it supplies the threshold current of laser diode 22 to summation point 46.

The signal, exhibiting great changes in level, of bypass gain path 40 is supplied to summation point 46. Because the amplification ideally corresponds to the reciprocal value of the effective feedback, feedback and amplification in return 24 compensate each other so that the alternating component of the reference signal, having the great changes in level, is supplied at return signal input 16. The threshold current of the laser diode is already subtracted by the laser diode to a certain extent, because currents smaller than the threshold current do not contribute to the return. Because the reference signal, having great changes in level, as well, is applied at reference signal input 14 of servo amplifier 38, the alternating component of the reference signal drops out in the difference formation.

Laser diode 22 is therefore operated both with the threshold current supplied by servo amplifier 38 and also with the reference signal, having great changes in level, from bypass amplifier 42, which enables rapid erase and write operations. Because of the formation of the difference between the signals applied at inputs 14, 16 of servo amplifier 38, servo amplifier 38 is not controlled in the transient state, so that in the described ideal case, a complete decoupling of servo gain path with servo amplifier 38 and bypass gain path 40 with bypass amplifier 42 is achieved.

To achieve this type of ideal decoupling also in temperature-induced drift effects of components, particularly laser diode 22, and in production-induced scatter, an embodiment provides for the determination of the difference between the reference signal and return signal and for its use by controller 32 and block 42 to set the amplification of bypass gain path 40. In so doing, the setting of the amplification in the subject of FIG. 3 on the direct current side of reference signal generator 41 occurs with a change in current I2. In the subject of FIG. 3, values of the reference signal and return signal are supplied to controller 32 via connections 52 and 54 in a high-impedance manner. These values are determined during dynamic operation.

Figure 4:
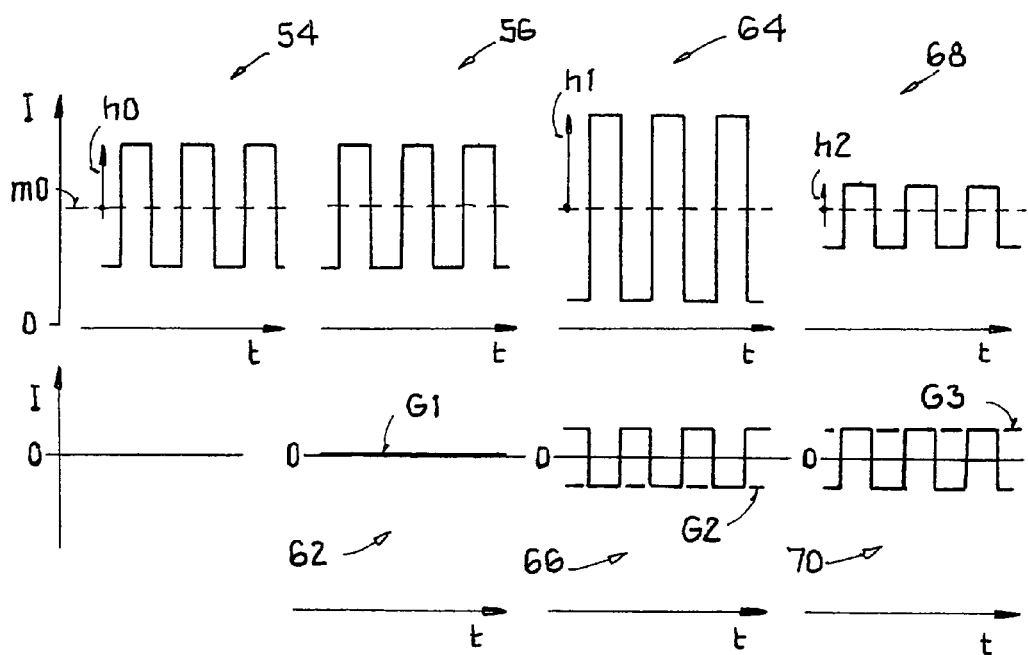
FIG. 4 show timing signals, as they occur in an embodiment of the signal amplification method of the invention in the subject of FIG. 3.

Signals, as they are used and determined in this type of measurement, are shown schematically in FIG. 4. Reference signal generator 30 supplies, e.g., a pulse sequence 54 to reference signal input 14 of servo amplifier 38. Closed switch 44 activates bypass gain path 40. The pulse sequence 54 fluctuates as a rectangular signal with a level height h0 around an average value m0. If the amplification of bypass gain path 40 corresponds precisely to the feedback attenuation of the control loop, the curve series 56, which corresponds to pulse sequence 54, occurs at return signal input 16 of servo amplifier 38. Therefore, signal 62 in FIG. 4, thus the value zero, which here also corresponds to the direct current value G1=0, results as the difference between the two signals 54 and 56. In this case, the values of signals 54 and 56 can be sampled, for example, by a sample/hold detector. Alternatively, the values can be determined by a peak detector. Both the sample/hold detector and the peak detector can be integrated into controller 32. In each case, maxima (minima) of signals 56, 64, 68 are detected as direct current values and compared with maxima (minima) of reference signal 54, also detected as direct current values. The form of signals 54, 56, 64, and 68 is not limited to the shown rectangular form with two level heights in each case, but can also have other different step heights in a pulse sequence. In this case as well, the maximum or minimum of the pulse sequences is again sought for the comparison.

The curve series 64, whose level height h1 is greater than the level height h0 of the reference pulse sequence 54, results at a too great amplification of bypass amplifier 42. The difference then corresponds to a curve course, as depicted as signal 66 in FIG. 4. The difference, formed as the direct current value G2, between the maxima of signals 64 and 54 stands out in this case because its value is negative. This is used by controller 32 to reduce the amplification of bypass gain path 40 by a reduction of current I2.

The curve series 68, in contrast, occurs at return signal input 16 of servo amplifier 38, when the amplification of bypass gain path 40 is too low. At return signal input 16, signal 68 then varies only with a level height h2, which is smaller than level height h0 of the reference signal fluctuation at reference signal input 14 of servo amplifier 38. A time course then occurs as the difference between signals 54 and 68, as is represented in FIG. 4 by curve series 70. The difference, formed as the direct current value G3, between the maxima of signals 54 and 68 stands out because its value is positive. In this case, controller 32 increases the amplification of the bypass gain path by increasing current I2.

If instead of the maxima of the pulse sequences, the minima are detected in each case, the controller recognizes a too great amplification at a positive direct current value of the difference, whereas it recognizes a too small amplification at a negative direct current value of the difference.

Figure 5:
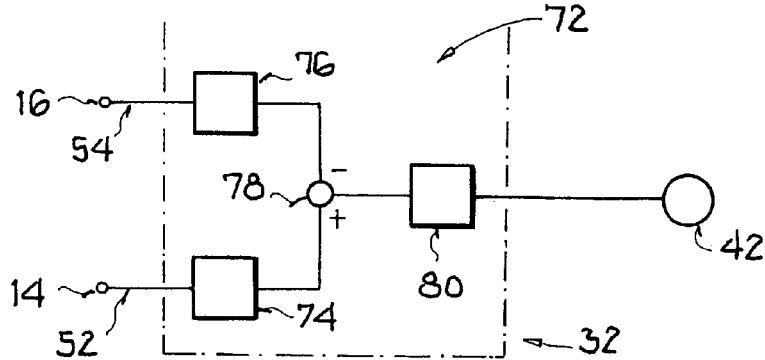
FIG. 5 is an array for measuring the properties of signals of FIG. 4.

FIG. 5 shows a sensor 72 integrated into controller 32. Sensor 72 has a first peak detector 74, which detects the maximum or minimum values of the reference signal at the reference input 14 of servo amplifier 38. A second peak detector 76 is connected to return signal input 16 of servo amplifier 38 and accordingly detects maximum or minimum values of the return signal. A difference formation for the detected maximum or minimum values occurs in a linkage 78. Block 80 evaluates the difference formed in linkage 78 in a manner explained in regard to FIG. 4, in that it senses, for example, the values of the difference with a specific clock, whose period duration is greater than the transient period of servo amplifier 38. Furthermore, block 80 controls direct current source 42, and/or bypass amplifier 42 as a function of the evaluated difference, and thereby controls the amplification of bypass amplifier 42.

Figure 6:
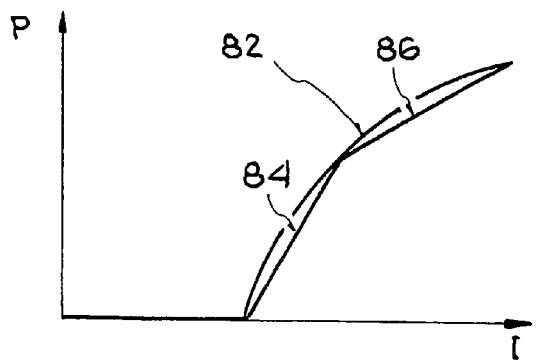
FIG. 6 is a second characteristic of a laser diode, which has a nonlinear course.

FIG. 6 shows a second characteristic 82 of a laser diode, which has a nonlinear course. The problem arises in nonlinear characteristic 82 that higher levels of the reference signal in amplifier array 36 of FIG. 4 experience a weaker amplification than lower levels. This causes an amplification of bypass amplifier 42, which corresponds, e.g., in the lower region of characteristic 86 to the reciprocal value of the feedback attenuation, to deviate therefrom in the upper region of characteristic 82. As a result, in an amplifier array 36, as depicted in FIG. 3, the desired complete decoupling of the servo gain path and bypass gain path can be achieved only in a subarea of nonlinear characteristic 82.

Figure 7:
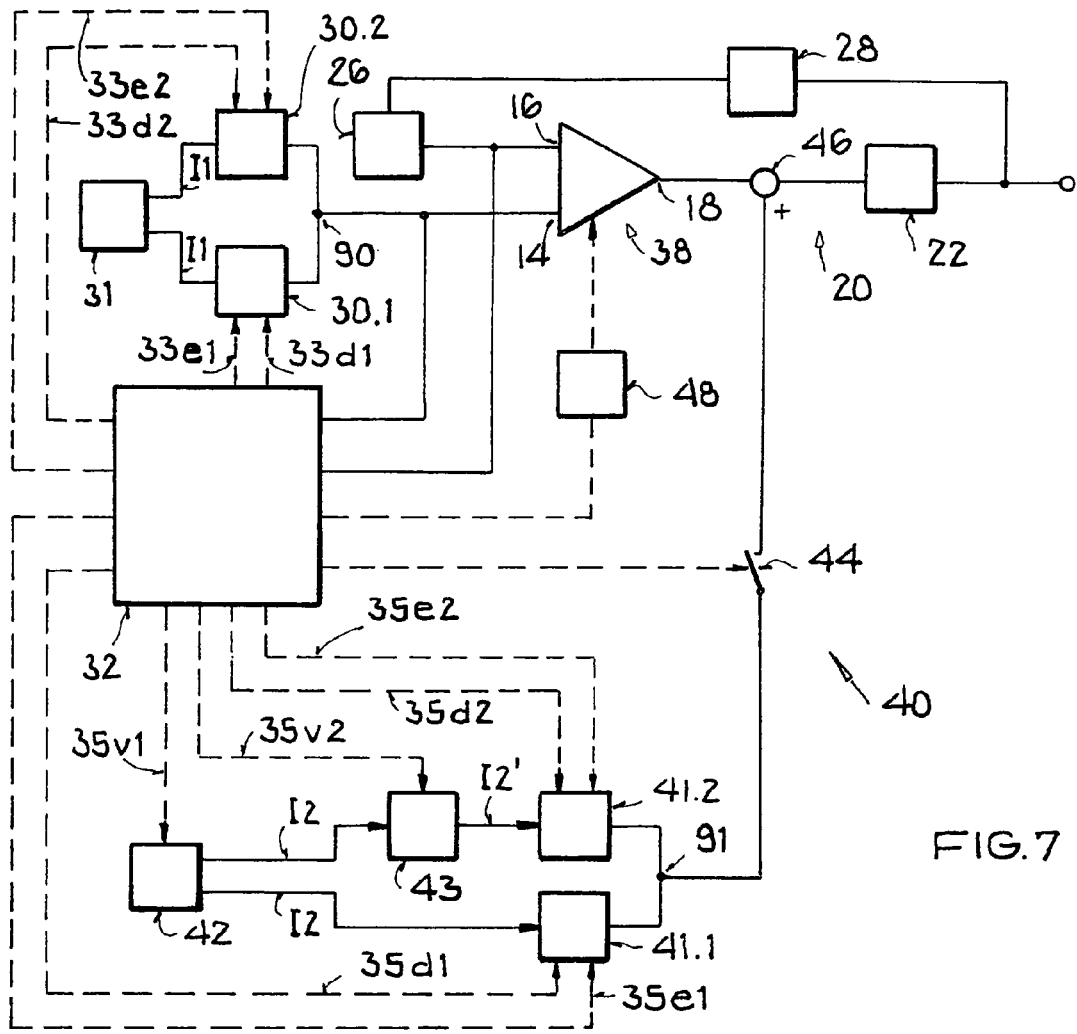
FIG. 7 illustrates a second embodiment of the amplifier array of the invention.

FIG. 7 shows another modified amplifier array 88, which overcomes this deficiency and uses an approximation of nonlinear characteristic 82 with a steeper straight section 84 and a flatter straight section 86. In this case, the reference characters, which were already used in FIG. 3, correspond to the components depicted in relation to FIG. 3, so that a repetition of the function of these components is superfluous here. Differences between the subjects of FIGS. 3 and 7 result because reference signal generator 30 from FIG. 3 was replaced in FIG. 7 by several reference signal generators 30.1, and 30.2 and reference signal generator 41 of FIG. 3 was replaced in FIG. 7 by several reference signal generators 41.1 and 41.2 and another amplification component 43. Reference signal generators 30.1 and 41.1, for example, provide pulse contributions and/or direct current contributions, which belong to the steeper straight section 84, whereas reference signal generators 30.2 and 41.2 provide contributions, which lead to the flatter straight section 86.

In keeping with the number of reference signal generators, the number of the associated enable and data signal connections has also increased. The connections 33e1, 33d1 (33e2, 33d2; 35e1, 35d1; 35e2, 35d2) in each case transmit enable and data signals to reference signal generator 30.1 (30.2; 41.1; 41.2). The contributions of several reference signal generators 30.1 and 30.2 are added at summation point 90 and supplied to reference signal input 14 of servo amplifier 38. Similarly, contributions of reference signal generators 41.1 and 41.2 are added at summation node 91 in bypass gain path 40.

The highest signal level is necessary for writing, a substantially lower signal level for reading, and a signal level between the two other signal levels for erasing. It is understood, however, that these three signal levels are indicated here only as being representative of as many different signal levels as desired, which can be used in different writing strategies. A write signal can be formed, e.g., by the sum of contributions of all reference signal generators 30.1, 30.2, 41.1, 41.2 and can then lie in the flat characteristic section 86 of characteristic 82. Read and erase signals, in contrast, are formed without contributions of reference signal generators 30.2 and 41.2 and lie in the steeper section 84 of characteristic 82. The approximation of the nonlinear characteristic by the two straight sections 84, 86 occurs in the shown embodiment according to this assignment.

To be able to set in both cases the amplification, appropriate in each case, of bypass gain path 40, the additional amplification component 43 is provided. Additional amplification component 43 provides an output current I2', which in the case of characteristic 82 is greater than input current I2. The greater output current I2' thereby represents a greater amplification, by which the greater feedback attenuation of laser diode 22 in the lower characteristic section, thus in the region of the straight section 86 of flat characteristic 82, is compensated in this characteristic region by an overproportional increase in the pulse in the flatter characteristic region. An overproportional increase in this case is understood to be, for example, that a quotient (contribution (41.2) divided by contribution (41.1)) is greater than a quotient (contribution (30.2) divided by contribution (30.1)).

The amplification can again be adapted as it was explained in principle in relation to FIGS. 4 and 5. Thereby, direct current values of the minimum values of signals 54 and 56, 64, 68 of FIG. 4 are used for adaptation of the amplification occurring by means of block 42, therefore particularly for read and erase signals.

The action on current I2 occurs via connection 35*v*1. The adaptation of the amplification, occurring in addition via block 43 for the high signal level, thus in particular for write signals, which lie within the flatter section 86 of characteristic 82, is based in contrast on an evaluation of the maximum values, detected as direct current values, of signals 54 and 56, 64, 68 of FIG. 4 and via controller 32 leads to an additional action on current I2' via connection 35*v*2.

Figure 8:
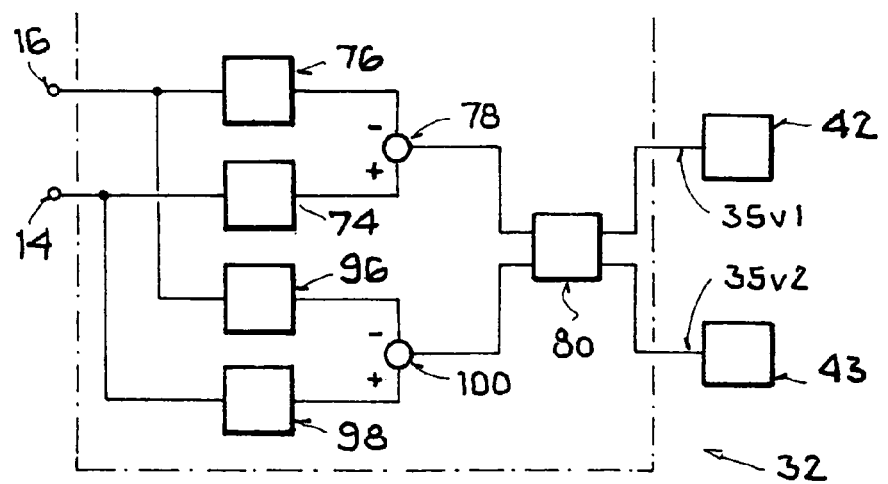
FIG. 8 is an array for measuring the properties of signals of FIG. 4 for nonlinear characteristics.

For detection of the indicated direct current values of the minimum value and maximum value of these signals, a sensor 94 is integrated into controller 32, which has, for example, the structure depicted in FIG. 8. The upper half of the structure of FIG. 8 has reference characters 14, 16, 74, 76, 78, 80, and 42, as have already been used for sensor 72 of FIG. 5. The function of these components corresponds to the function of sensor 72, which has already been described, whereby these components in the case of FIG. 8 are intended to detect minimum values of signals 54 and 56, 64, 68 of FIG. 4.

This structure is supplemented by two other peak detectors 96, 98 and a linkage 100, which detect the maximum values of signals 54 and 56, 64, 68 of FIG. 4. The detected minimum values are used for adaption of amplification values, as they are set via block 42 or block 42 and 43. The detected maximum values are used to set amplification values, as they are set in addition by block 43.

The difference formed in node 78 can be charged by a digital controller integrated into block 80 either only for controlling the amplification via actions on block 42, or also for controlling the amplification in blocks 42 and 43. The difference formed in node 100, in contrast, is used only for controlling the amplification via actions on block 43.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A signal amplification method comprising the steps of:
   amplifying a difference between a reference signal, having different level heights, and a return signal, attenuated by feedback attenuation, of an output signal path by a servo gain path; and
   connecting the servo gain path during operation with great changes in level to a bypass gain path, which is supplied phase-coupled to the reference signal and supplies the output signal path together with the servo gain path.

2. The signal amplification method according to claim 1, wherein the servo gain path is operated with a smaller bandwidth with a connected bypass gain path than without a connected bypass gain path.

3. The signal amplification method according to claim 2, wherein a controllable amplification of the bypass gain path is set to a function of a reciprocal value of the feedback attenuation.

4. The signal amplification method according to claim 3, wherein the difference between the reference signal and return signal is determined by a sensor.

5. The signal amplification method according to claim 4, wherein the amplification of the bypass gain path is controlled by a controller coupled to the sensor as a function of the determined difference.

6. The signal amplification method according to claim 5, wherein a difference between the maximum values of the return signal and the maximum values of the reference signal and/or a difference between the minimum values of the return signal and the minimum values of the reference signal are formed.

7. The signal amplification method according to claim 6, wherein overproportionally higher pulse changes in the bypass gain path are set during operation with high signal levels of the reference signal than at low signal levels of the reference signal.

8. An amplifier array comprising:
   a servo amplifier that has a reference signal input, a return signal input, and an output signal connection, which supplies an output signal path; and
   a reference signal generator, which supplies reference signals with different level heights to the reference signal input, and with a return that supplies a signal attenuated by a value of a feedback attenuation from the output path as a return signal to the return signal input,
   wherein the servo amplifier supplies an amplified difference between the reference signal and return signal in the output signal path, and
   wherein the amplifier array has a connectable bypass gain path, which in a connected state is supplied phase-coupled to the signal of the reference signal generator, and which supplies a bypass output signal in the output path.

9. The amplifier array according to claim 8, wherein a bandwidth of the servo amplifier is modifiable between variably large values, and wherein the servo amplifier functions with smaller bandwidths with the connected bypass gain path than without the connected bypass gain path.

10. The amplifier array according to claim 8, wherein the bypass gain path has a controllable amplification, and wherein the amplifier array sets the controllable amplification to a function of the reciprocal value of the feedback attenuation.

11. The amplifier array according to claim 8, further comprising a sensor, which determines the difference between the reference signal and return signal.

12. The amplifier array according to claim 11, further comprising a controller, which is coupled to the sensor, for controlling the amplification of the bypass gain path depending on the determined difference.

13. The amplifier array according to claim 12, wherein the sensor forms a difference between maximum values of the return signal and maximum values of the reference signal and/or a difference between minimum values of the return signal and minimum values of the reference signal.

14. The amplifier array according to claim 13, wherein the amplifier array sets a controllable amplification of the bypass amplifier to a function of a reciprocal value of the feedback attenuation overproportionally greater pulse changes in the bypass gain path during operation with high signal levels of the reference signal than at low signal levels of the reference signal.

* * * * *